United States Patent [19]
Fujimoto

[11] Patent Number: 5,982,675
[45] Date of Patent: Nov. 9, 1999

[54] CACHE MEMORY AND MICROPROCESSOR HAVING THE SAME

[75] Inventor: Yukihiro Fujimoto, Tokyo, Japan

[73] Assignee: Kabushiki Kaisha Toshiba, Kawasaki, Japan

[21] Appl. No.: 08/972,731

[22] Filed: Nov. 18, 1997

[30] Foreign Application Priority Data

Nov. 21, 1996 [JP] Japan .................................. 8-310902

[51] Int. Cl.$^6$ .............................. G11C 16/04; G11C 8/00
[52] U.S. Cl. ................................ 365/189.05; 365/189.07; 365/230.03
[58] Field of Search ......................... 365/189.05, 189.07, 365/230.03, 230.05, 230.08; 711/3

[56] References Cited

U.S. PATENT DOCUMENTS

| | | | |
|---|---|---|---|
| 4,975,872 | 12/1990 | Zaiki ................................ | 365/189.07 |
| 5,453,947 | 9/1995 | Seta et al. ........................ | 365/189.07 |
| 5,715,426 | 2/1998 | Takahashi et al. ................ | 365/189.07 |
| 5,825,682 | 10/1998 | Fukui ............................... | 365/189.07 |
| 5,845,309 | 12/1998 | Shirotori et al. .................. | 365/189.07 |

*Primary Examiner*—Trong Phan
*Attorney, Agent, or Firm*—Foley & Lardner

[57] ABSTRACT

A memory unit has, for each bit line, a latch circuit for holding data read out of a memory cell until the next access takes place, and a comparator for comparing data to be written into the memory cell and the data held in the latch circuit. If read and write operations consecutively occur at the same address and if some data bits to be written agree with corresponding data bits held in the latch circuits, there is no need of writing data for these bits. Accordingly, the write operation is disabled for these bits and is enabled only for bits that show disagreement between the data to be written and the data stored in the latch circuits. The power consumption of memory cells in a write operation is far greater than that in a read operation. Accordingly, omitting unnecessary write operations in the manner mentioned above greatly reduces the power consumption of the memory unit and the power consumption of a microprocessor that employs the memory unit.

24 Claims, 10 Drawing Sheets

CACHE MEMORY AND MICROPROCESSOR HAVING THE SAME

BACKGROUND OF THE INVENTION

1. Field of the Invention

The present invention relates to reducing the power consumption of a memory unit, and particularly, to a low-power-consumption memory unit and a microprocessor that employs such a memory unit and is suitable for use with portable apparatus.

2. Description of the Prior Art

Various types of portable apparatus are widely used. They must operate for a long time with batteries, and therefore, semiconductor memories incorporated therein must operate at low power consumption. The portable apparatus also needs a high-speed microprocessor. To improve performance and reduce power consumption, the microprocessors employ a cache memory that helps reduce the number of access operations with respect to a main memory.

FIG. 1 shows a microprocessor 101 incorporating a cache memory 102, according to a prior art. The cache memory 102 has an address decoder 103 for decoding an address provided by a CPU 190, a tag memory cell array 104 for storing tag data that is accessed with the decoded address, a data memory cell array 105 for storing data related to the tag data stored in the array 104, a conventional read/write circuit 106 for reading and writing data from and to the array 104, a comparator unit 107 for comparing tag data that is read out of the array 104 through the conventional read/write circuit 106 with a tag address that is a part of the address provided by the CPU 190 and determining whether they agree (hit) or disagree (miss) with each other, and a conventional read/write circuit 108 for reading and writing data from and to the array 105. The microprocessor 101 has a cache controller 109 for controlling the cache memory 102, and a bus interface unit 110 serving as an interface with respect to an external memory 200.

The CPU 190 provides a memory access request that includes an address where data must be read. Lower bits of the address are supplied to the address decoder 103 and are used to access the tag memory cell array 104 and data memory cell array 105. The accessed memory cells of the arrays 104 and 105 provide each a minute voltage signal of about 100 mV to the respective conventional read/write circuits 106 and 108. The read/write circuits 106 and 108 amplify the minute voltage signal and generate data. The comparator unit 107 compares the read tag data with a tag address represented with higher bits of the address contained in the memory access request provided by the CPU 190. If the comparator unit 107 determines that they agree with each other, the data memory cell array 105 has the requested data, and therefore, the data read out of the data memory cell array 105 is transferred to the CPU 190. If the comparator unit 107 determines that they disagree with each other, the data memory cell array 105 does not have the requested data, and therefore, the cache controller 109 provides the bus interface unit 110 with an access request for the external memory 200.

To improve system performance, the cache memory 102 must hold frequently accessed data. For this purpose, the data transferred from the external memory 200 to the CPU 190 is simultaneously stored in the cache memory 102 under the control of the cache controller 109. This operation is called a refill operation. In the refill operation, the tag address of the accessed address and the data read out of the external memory 200 are written into the arrays 104 and 105 through the conventional read/write circuits 106 and 108.

FIG. 2 shows examples of the conventional read/write circuit 106 and comparator unit 107 of the tag memory cell array 104. The conventional read/write circuit 106 has, for every bit-line pair that consists of a pair of bit lines BL and $\overline{BL}$, a write circuit 111 for writing tag data and a sense amplifier 112 for amplifying tag data read through the bit lines BL and $\overline{BL}$. The comparator unit 107 has a comparator 113 provided for every bit-line pair, for comparing a tag address provided by the CPU 190 with tag data read by the sense amplifiers 112, and a hit/miss logic 114 for receiving comparison results from the comparators 113 and determining whether or not the tag address agrees with the tag data.

When the cache memory 102 is accessed, a sense amplifier enable signal becomes active to make each sense amplifier 112 amplify a minute voltage signal sent from a memory cell through the bit lines BL and $\overline{BL}$. The amplified minute voltage signal from each sense amplifier 112 represents one bit of tag data, which is compared by the comparator 113 with a corresponding bit of a tag address. Comparison results of the comparators 113 are supplied to the hit/miss logic 114. If the tag data agrees with the tag address bit by bit, the hit/miss logic 114 provides a hit signal, and if not, a miss signal. The hit or miss signal is sent to the cache controller 109.

If the hit signal is provided, data read out of the data memory cell array 105 at the instant is sent as it is to the CPU 190, and the cache memory access completes. On the other hand, if the miss signal is provided, an access request for the external memory 200 is made by the cache controller 109. When the requested data is read out of the external memory 200, a refill operation starts. In the refill operation, a write enable signal becomes active to make the write circuits 111 provide the bit-line pairs with tag data to be written into the tag memory cell array 104.

FIG. 3 shows an example of one of the write circuits 111. Transfer gates 115 and 116 connect the bit lines BL and $\overline{BL}$ to write buffers 117 and 118, respectively. The transfer gates 115 and 116 are opened and closed in response to write enable signals EN and $\overline{EN}$. The write buffers 117 and 118 buffer data to be transferred to the bit lines BL and $\overline{BL}$ through the transfer gates 115 and 116. When writing data, the transfer gates 115 and 116 become conductive, and the write buffers 117 and 118 fully swing the bit lines BL and $\overline{BL}$ between predetermined source voltages.

The conventional read/write circuit 108 of the data memory cell array 105 has the same structure as the conventional read/write circuit 106 of the tag memory cell array 104. The conventional read/write circuit 108, however, is not provided with the comparator unit 107, and therefore, data read out of the data memory cell array 105 is directly provided outside, and data to be written into the data memory cell array 105 is provided by the external memory 200.

In the refill operation of the cache memory 102, every bit line of the arrays 104 and 105 is subjected to a write operation. The write operation fully swings each bit line between a high level supply voltage and a low level supply voltage. Since the bit lines have load such as wiring capacitance and transistor junction capacitance, the full-swing write operation consumes a lot of electric power compared with a read operation that involves the minute voltage signal and a small current. In a low-power-consumption cache memory, currents produced by the charging and discharging of bit lines reach about a half of the power consumption of the refill operation. As a result, the power consumption of the refill operation is about 30% larger than that of any other access operation. A store operation (a write operation) also consumes a lot of electric power because it involves a write operation of a data bit width.

This large power consumption problem occurs not only in the cache memories but also in other types of memories. Namely, a current consumed by a write operation is larger than a current consumed by a read operation because the write operation fully swings bit lines between the high and low level supply voltages to charge and discharge the wiring capacitance and transistor junction capacitance.

More precisely, the prior art writes data by fully swinging bit lines for a supply voltage of 5 V, 3.2 V, 2 V, or 1.5 V. This involves large power consumption compared with a read operation that needs only a minute voltage of about 100 mV. This is the reason why it is difficult to reduce the power consumption of a cache memory although the portable apparatus that uses the cache memory is required to operate at low power consumption.

SUMMARY OF THE INVENTION

An object of the present invention is to provide a memory unit capable of saving the current in a write operation, thereby reducing power consumption.

Another object of the present invention is to provide a cache memory capable of omitting unnecessary write operations, or the write operations on hit bits, thereby reducing write currents and power consumption.

Still another object of the present invention is to provide a microprocessor capable of minimizing a current consumed during a write operation, thereby reducing power consumption.

Still another object of the present invention is to provide a memory unit capable of operating for a long time with batteries.

In order to accomplish the objects, a first aspect of the present invention provides a memory unit at least having a memory cell array having memory cells that are arranged in an X–Y matrix and are connected to redetermined bit lines, latch circuits arranged for the bit lines, respectively, for holding data read out of the memory cells through the bit lines, comparators arranged for the bit lines, respectively, for comparing data to be written into the memory cells with data held in the latch circuits and determining whether or not they agree with each other, and write control circuits arranged for the bit lines, respectively, for controlling the write operation of the memory cells according to comparison results provided by the comparators. If read and write operations consecutively occur on the same bits and if the comparators determine that some bits of data to be written by the write operation agree with data held in the latch circuits, the write control circuits corresponding to the agreed bits disable the write operation for the bits.

There is no need of writing the same data as that stored in the latch circuits. Accordingly, the first aspect omits such a useless write operation. As explained above, a write operation dissipates larger power than a read operation, and therefore, omitting a useless write operation greatly reduces power consumption.

The first aspect is properly applicable to a cache memory, and therefore, a second aspect of the present invention provides a cache memory. The cache memory has a tag memory cell array having tag memory cells that are arranged in an X–Y matrix and are connected to predetermined tag bit lines, a data memory cell array having data memory cells that are arranged in an X–Y matrix and are connected to predetermined data bit lines, tag latch circuits arranged for the tag bit lines, respectively, for holding tag data read through the tag bit lines, tag comparators arranged for the tag bit lines, respectively, for comparing data to be written with tag data held in the tag latch circuits, and tag write control circuits arranged for the tag bit lines, respectively. In a read operation, the tag latch circuits hold tag data read out of the tag memory cell array. In a refill operation that follows the read operation, the tag comparators compare data to be written with the tag data held in the tag latch circuits bit by bit. If any of the tag comparators shows agreement as a comparison result, the tag write control circuit corresponding to the tag comparator in question disables the write operation for the corresponding tag bit line during the refill operation.

If a cache miss occurs as a result of an access to the cache memory for required data, an external memory is accessed for the required data, and the data retrieved from the external memory is written into the cache memory. This is a refill operation. In the refill operation, data to be written into the tag memory cell array is equal to a tag address that has been used for detecting the cache miss. Namely, if there is a bit that shows agreement in the comparison test made by the tag comparators, corresponding bit data stored in the tag memory cell array is identical to bit data to be written in the refill operation, and there is no need of writing the same data as that already stored. Accordingly, the tag latch circuits of the second aspect hold tag data upon the occurrence of a cache miss until a refill operation for the cache miss is carried out. At the same time, the second aspect holds the comparison result of each bit. Each of the tag write control circuits provides an OR of an inversion of the comparison result and a write enable signal that is used to carry out a write operation in the refill operation. The output of the tag write control circuit is used as "a bit write enable signal" for a corresponding write circuit, so that no write operation is carried out on a hit bit, and a write operation is carried out only on a missed bit.

In this way, the second aspect omits the write operation on a bit whose data stored in the tag memory cell array is the same as data to be written for the bit, thereby reducing currents that may be dissipated for the useless charging and discharging of bit lines. This results in greatly reducing the power consumption of the cache memory as a whole.

The second aspect of the present invention is also applicable to the data memory cell array. In this case, the cache memory further has data latch circuits arranged for the data bit lines, respectively, for holding data read out of the data memory cells through the data bit lines, data comparators arranged for the data bit lines, respectively, for comparing data to be written with the data held in the data latch circuits, and data write control circuits arranged for the data bit lines, respectively. In a read operation, the data latch circuits hold data read out of the data memory cell array. In a refill operation that follows the read operation, the data comparators compare data to be written with the data held in the data latch circuits bit by bit, and if any of the data comparators shows agreement as a comparison result, the data write control circuit corresponding to the data comparator in question disables the write operation for the corresponding data bit line during the refill operation.

On the data memory cell array side too, the data comparators arranged for the data bit lines, respectively, compare read data with data that have been retrieved from the external memory and are going to be written into the data memory cell array. A data write circuit for only a bit that shows disagreement is activated to write data for the bit in question. On the data memory cell array side, a write operation (a store operation) for writing data from a CPU into the data memory cell array writes the data in the next cycle after the detection of a hit. Accordingly, the data comparators compare read data with the data to be written, to write data only for bits that show disagreement, similar to the refill operation, to thereby omit useless write operations.

In this way, the second aspect of the present invention reduces power consumption not only in the refill operation but also in the store operation, to greatly reduce the power consumption of the cache memory.

A third aspect of the present invention provides a microprocessor having the cache memory of the second aspect. Namely, the microprocessor of the third aspect at least has a CPU, a cache controller, a bus interface unit, and the cache memory of the second aspect. The bus interface unit serves as an interface between the cache memory and an external memory.

If read and write operations consecutively occur at the same address in the cache memory, the third aspect compares data to be written by the write operation with data read by the read operation bit by bit and carries out no write operation for bits that show agreement between the data to be written and the read data. This results in omitting useless write operations, reducing currents consumed in writing data into the cache memory, and decreasing the power consumption of the microprocessor.

The microprocessor of the third aspect is applicable to portable apparatus that must operate for a long time with batteries.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
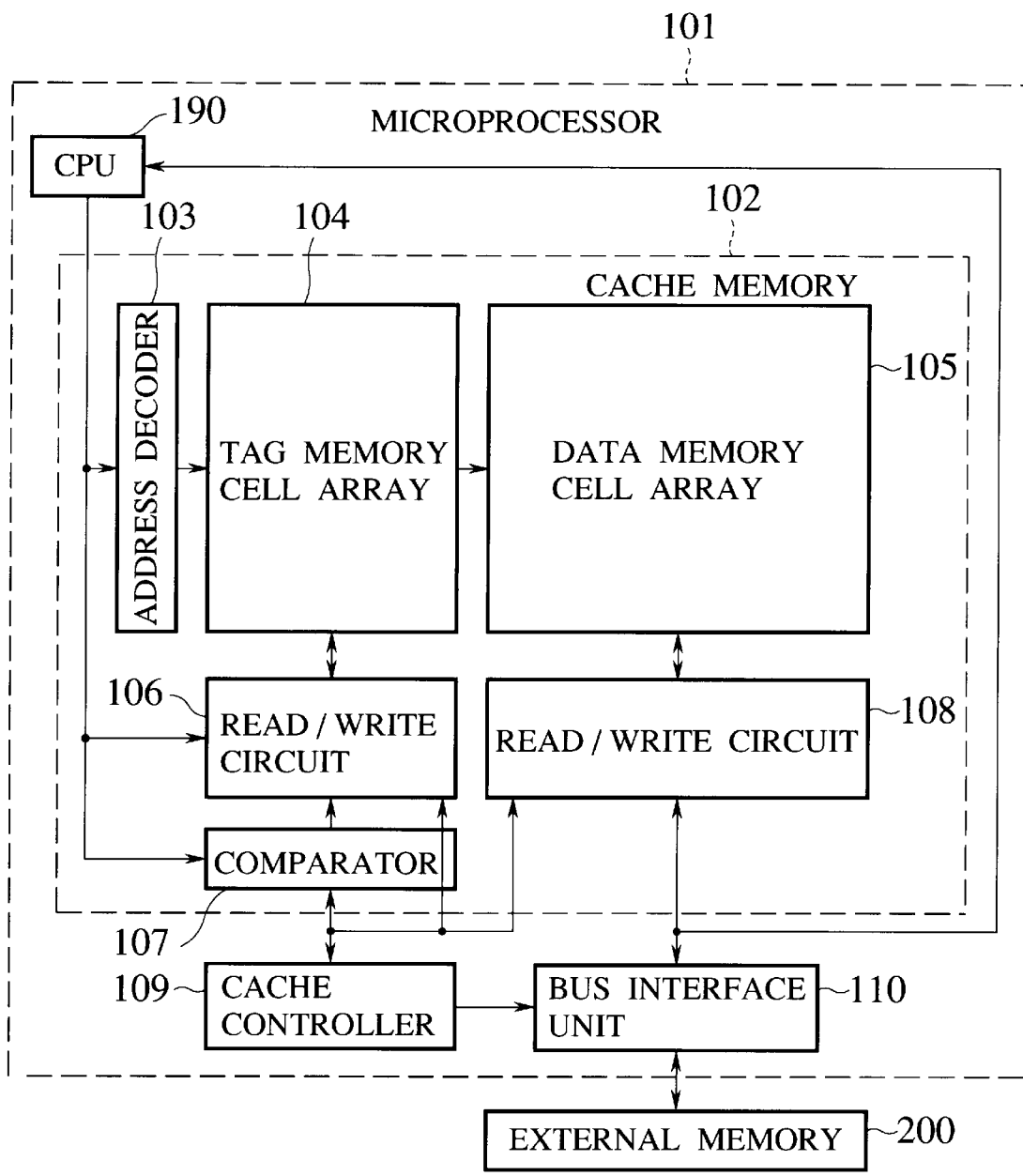
FIG. 1 shows a cache memory and peripheral elements thereof incorporated in a microprocessor according to a prior art.
Figure 2:
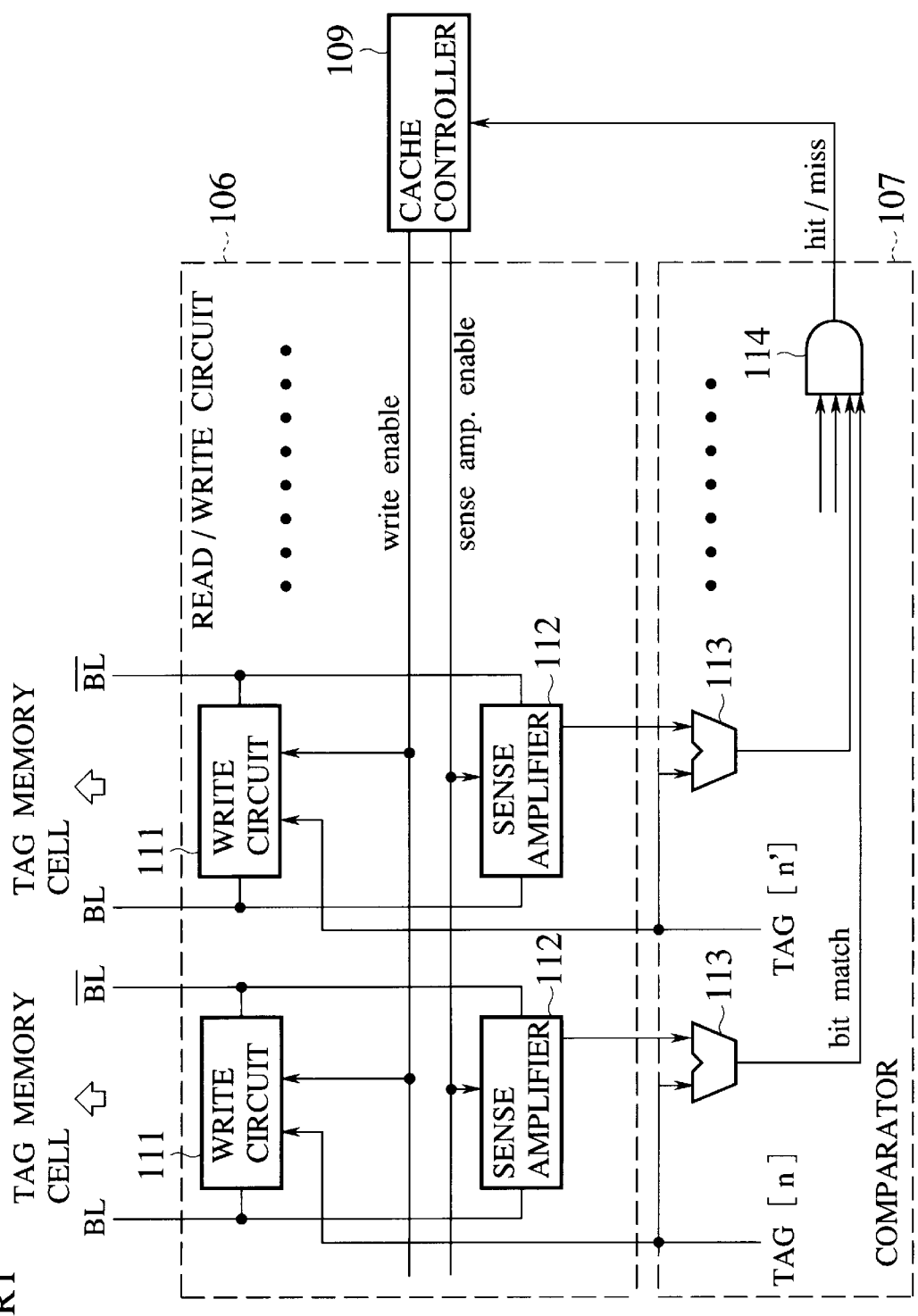
FIG. 2 shows examples of a conventional read/write circuit and a comparator unit arranged for a tag memory cell array of the cache memory of FIG. 1.
Figure 3:
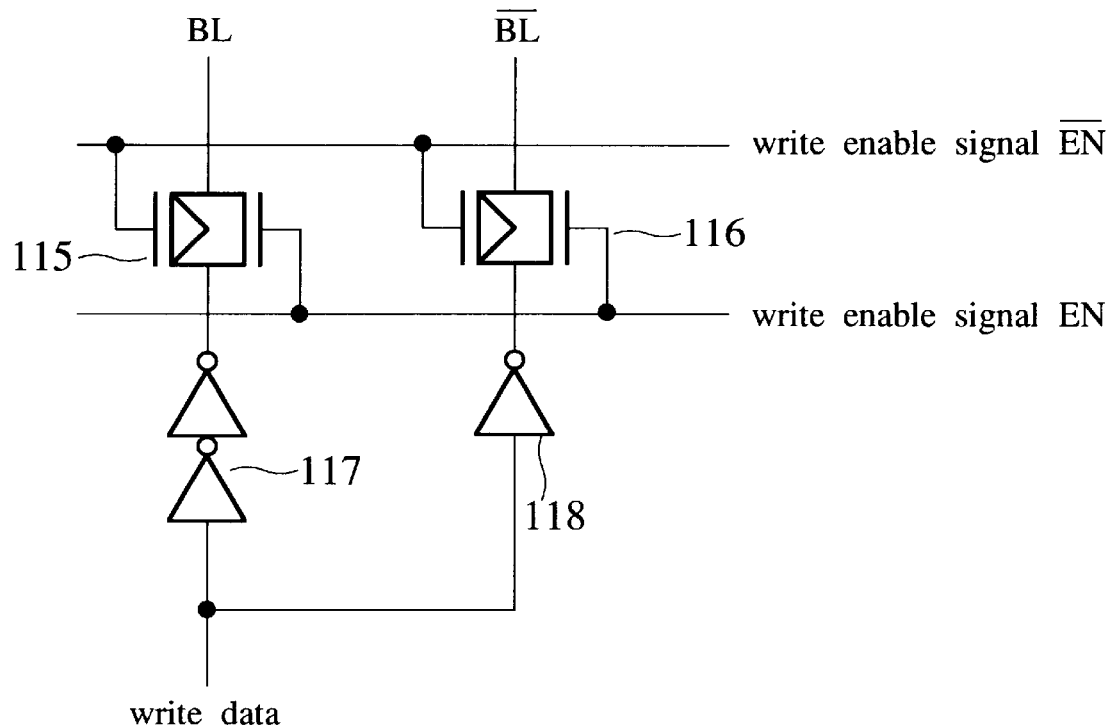
FIG. 3 shows an example of a write circuit shown in FIG. 2.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4:
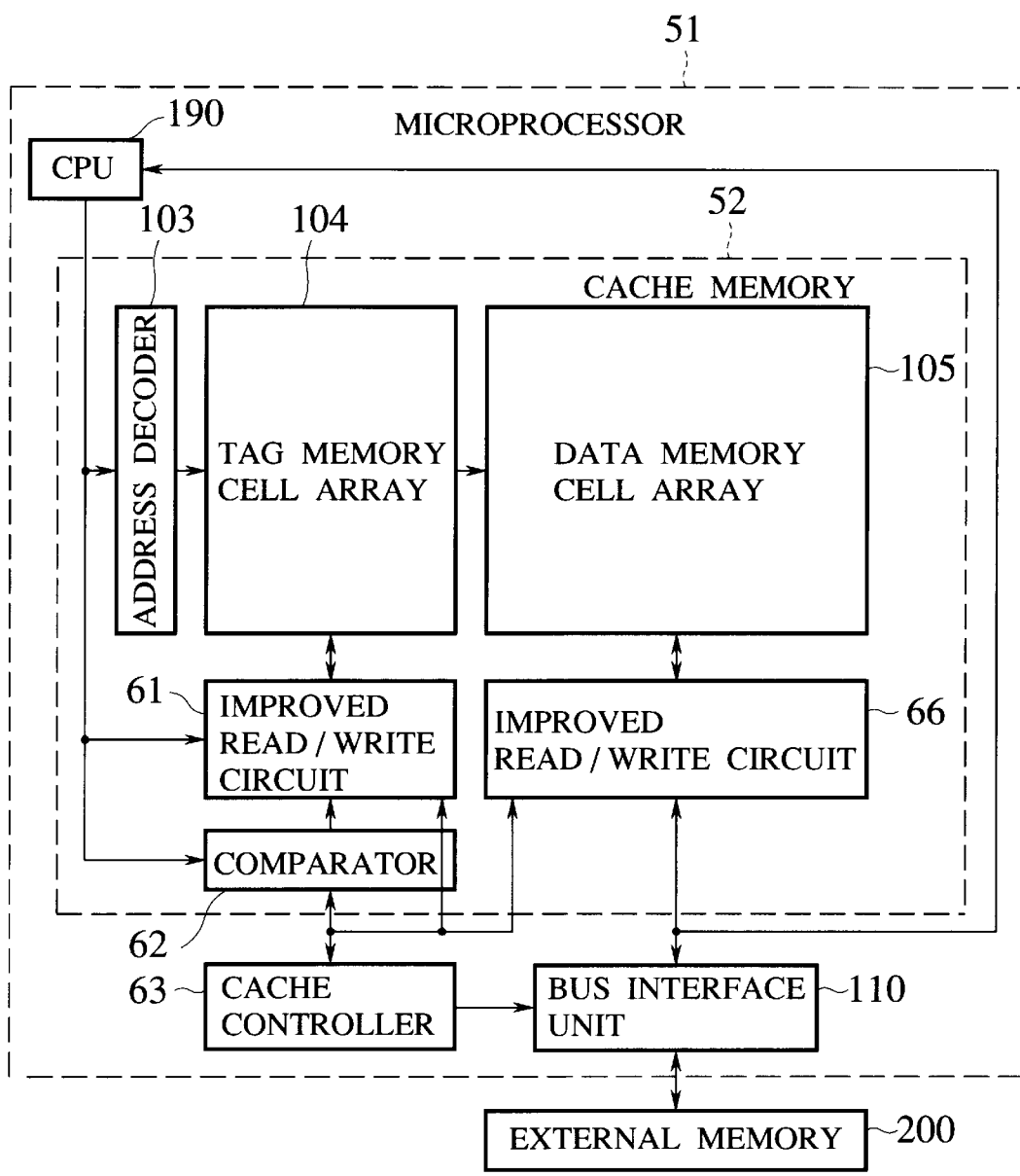
FIG. 4 shows a cache memory and peripheral elements thereof incorporated in a microprocessor according to a first embodiment of the present invention.

FIG. 4 shows a microprocessor according to the first embodiment of the present invention. The microprocessor 51 has at least a CPU 190, a cache memory 52, as an example of a memory unit of the present invention a cache controller 63, and a bus interface unit 110. The cache memory (memory unit) 52 is connected to an external memory 200 through the bus interface unit 110.

Parts that form the cache memory (memory unit) 52 will be explained. An address decoder 103 decodes an address provided by the CPU 190. A memory cell array called as a tag memory cell array 104 (hereinafter referred to as "the tag array 104") holds tag data that is accessed with an address provided by the address decoder 103. A data memory cell array 105 (hereinafter referred to as "the data array 105") stores data that are related to the tag data stored in the tag array 104. An improved read/write circuit 61 (hereinafter referred to as "the read/write circuit 61") is connected to the tag array 104. A comparator unit 62 compares tag data read out of the tag array 104 through the read/write circuit 61 with a tag address that is a part of an address provided by the CPU 190, and determines whether they agree (hit) or disagree (miss) with each other. An improved read/write circuit 66 (hereinafter referred to as "the read/write circuit 66") is connected to the data array 105. The cache controller 63 controls the cache memory 52. The bus interface unit 110 serves as an interface with respect to the external memory 200.

Figure 5:
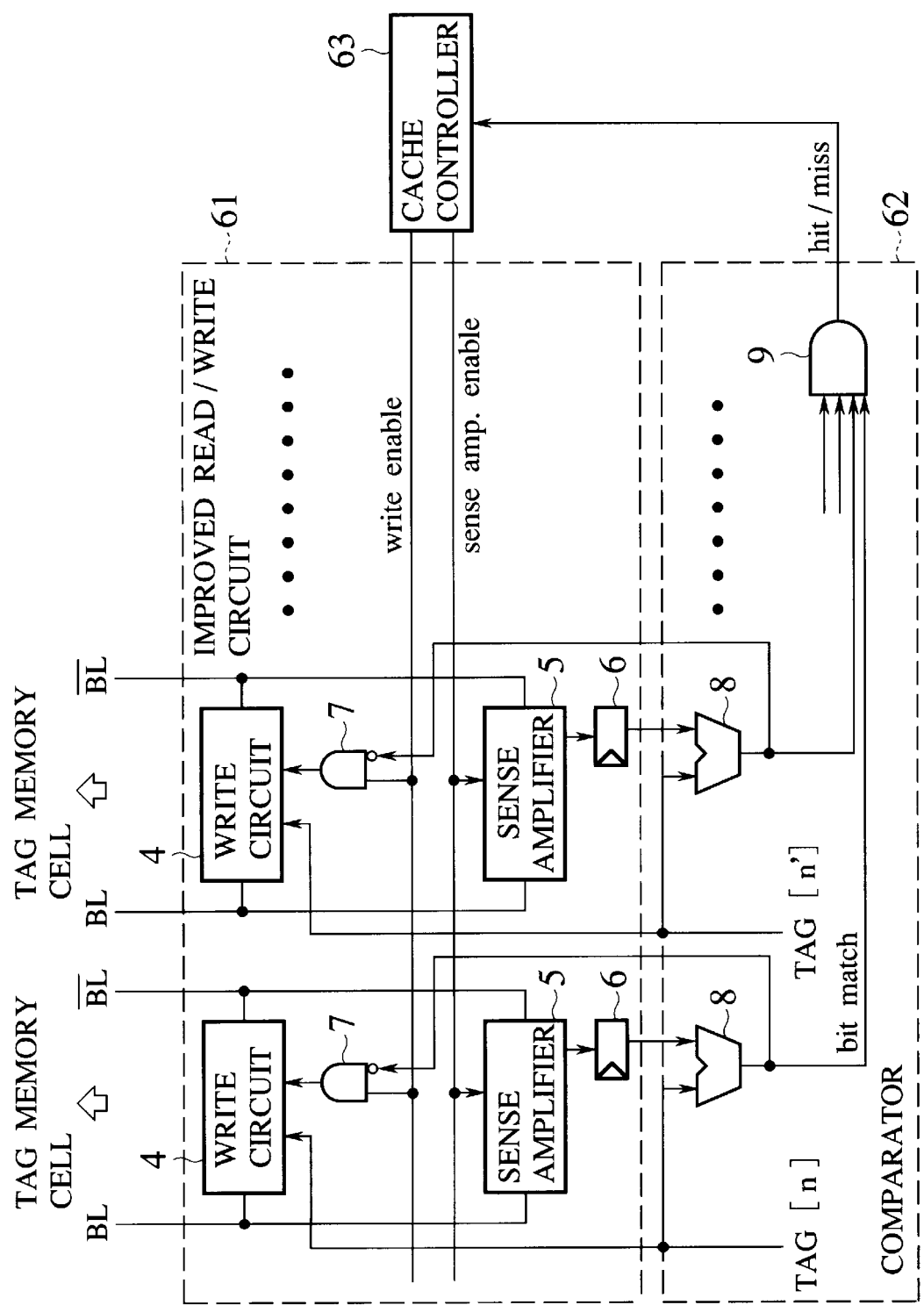
FIG. 5 shows a part of the cache memory of FIG. 4.

FIG. 5 shows the details of the read/write circuit 61, comparator unit 62, and cache controller 63, which feature the present invention. The read/write circuit 61 has, for each tag-bit-line pair that consists of a pair of tag bit lines BL and $\overline{BL}$, a tag write circuit 4 for writing data into a cell of the tag array 104 through the tag bit lines BL and $\overline{BL}$, a tag sense amplifier 5 for amplifying a tag data bit read out of a cell in the tag array 104 through the tag bit lines BL and $\overline{BL}$, a latch circuit called a tag latch circuit 6 for storing the tag data bit read by the tag sense amplifier 5 until the next tag data bit is read through the same tag bit lines, and a write control circuit called a tag write control circuit 7 for controlling the write operation of the tag write circuit 4. The comparator unit 62 has a comparator called a tag comparator 8 for each tag-bit-line pair, and a hit/miss logic 9 that receives comparison results from the tag comparators 8 and determines whether or not all bits show agreement. More precisely, each tag comparator 8 compares write data given to the tag write circuit 4 or a part of an address provided by the CPU 190 for searching the cache memory 52 for required data, with a tag data bit stored in the latch circuit 6 and determines whether they agree (hit) or disagree (miss) with each other.

Figure 6A:
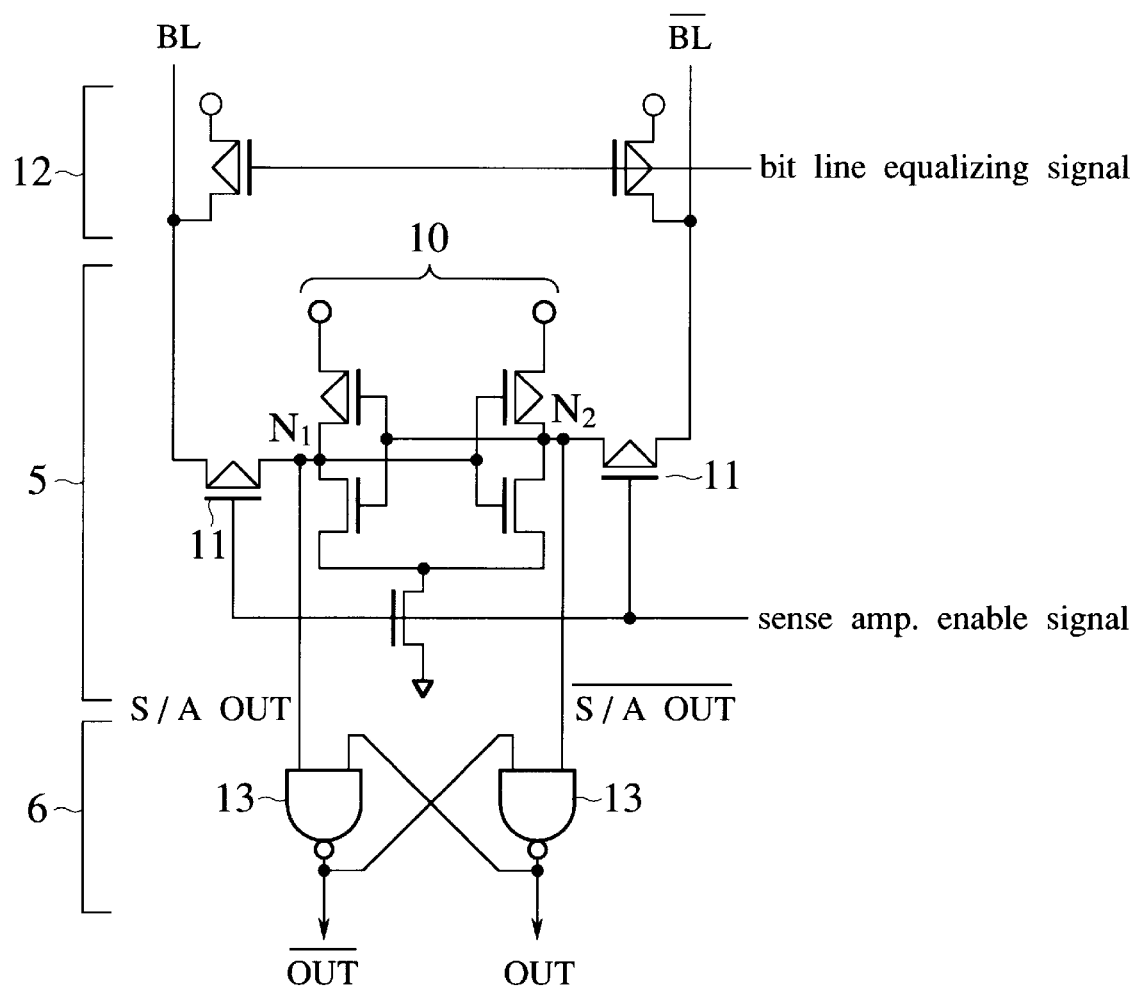
FIG. 6A shows examples of a sense amplifier and a latch circuit shown in FIG. 5.
Figure 6B:
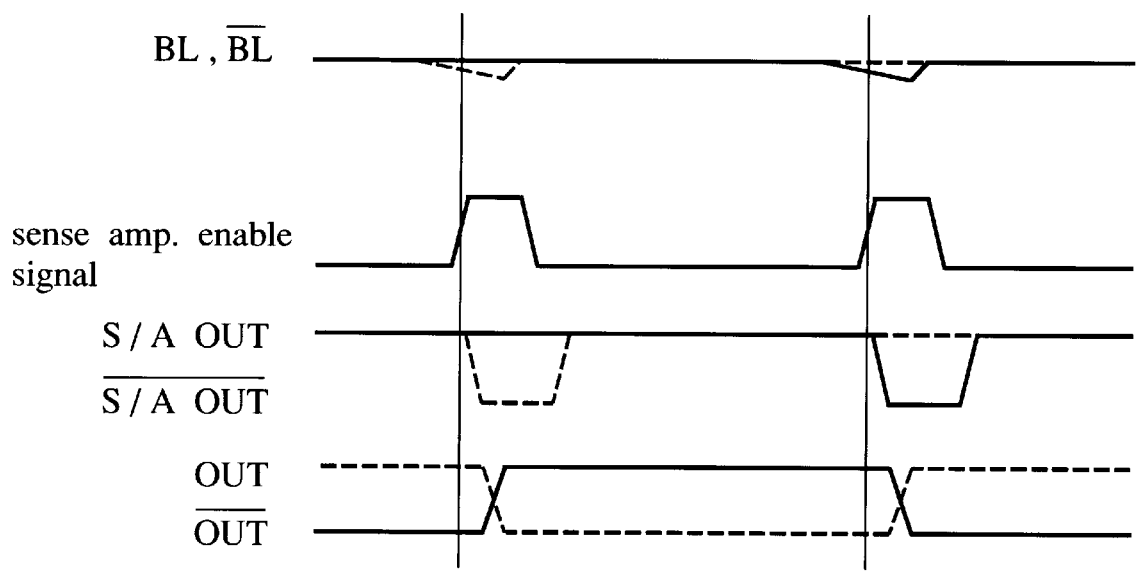
FIG. 6B is a waveform diagram showing a read operation of the sense amplifier and latch circuit of FIG. 6A.

FIG. 6A shows examples of the tag sense amplifier 5 and tag latch circuit 6, and FIG. 6B shows the waveforms of a read operation thereof. The tag sense amplifier 5 has a latch 10 and a transfer gate 11. The latch 10 consists of two inverters each made of a p-channel MOSFET and an n-channel MOSFET that are connected in series. Each of the transfer gates 11 consists of a first transfer MOSFET (p-channel MOSFET) and a second transfer MOSFET (p-channel MOSFET). Tag bit lines BL and $\overline{BL}$ are connected, through the transfer gates 11, to a first node N1 and a second node N2 of the latch 10 serving as output nodes of the tag sense amplifier 5, respectively. The bit lines BL and $\overline{BL}$ are connected to a first and second equalizing MOSFETs (p-channel MOSFETs) through respective one of main electrodes. The other main electrodes of each equalizing MOSFET are connected a high level power supply. The first and second equalizing MOSFETs constitute an equalizing circuit 12. When a bit line equalizing signal is low, the equalizing circuit 12 pre-charges the tag bit lines BL and $\overline{BL}$ to a high level supply voltage. When a sense amplifier enable signal becomes low level, the transfer gates 11 become conductive to transfer the potential of the bit lines BL and $\overline{BL}$ to the output nodes N1, N2 of the sense amplifier 5. In a memory read operation, the bit line equalizing signal becomes high level to turn off the equalizing circuit 12. As a result, the potential level of the tag bit line BL or $\overline{BL}$ slightly drops from the high level supply voltage depending on data stored in a corresponding tag memory cell, as shown in FIG. 6B. When a weak potential difference is produced between the tag bit lines BL and $\overline{BL}$, the sense amplifier enable signal is activated to high. Then, the transfer gates 11 become non-conductive to disconnect the tag bit lines BL and $\overline{BL}$ from the output nodes N1, N2 of the tag sense amplifier 5. This activates the latch 10 to amplify the weak potential difference, and the sense amplifier (S/A) outputs first signal S/Aout and second signal $\overline{S/Aout}$, as shown in FIG. 6B. These output signals S/A out and $\overline{S/Aout}$ are held in the tag latch circuit 6.

The tag latch circuit 6 consists of two NAND gates 13. Even when the potential of the sense amplifier enable signal changes from high to low level thereafter, the tag latch circuit 6 continuously keeps the data.

When the potential of the sense amplifier enable signal again becomes high level as shown in FIG. 6B, the tag sense amplifier 5 becomes active to provide new output signals S/Aout and $\overline{S/Aout}$, which are latched by the tag latch circuit 6. Until this instant, the tag latch circuit 6 holds the preceding data. In response to changes in the output signals S/Aout and $\overline{S/Aout}$, output signals out and $\overline{out}$ of the tag latch circuit 6 change. When the sense amplifier enable signal is in the low level, the output signals out and $\overline{out}$ of the tag latch circuit 6 maintain their levels.

If a cache miss occurs after a cache access operation, the external memory 200 is accessed for required data, and the data is written in the cache memory 52. This is a refill operation. In the refill operation, data to be written into the tag array 104 is equal to a tag address that has been used to detect the cache miss. Namely, when the tag comparators 8 compare data read out of the tag array 104 with the tag address bit by bit, data stored in the tag array 104 for hit bits are identical to those to be written from the external memory 200 into the tag array 104 in the refill operation. Then, these pieces of data for the hit bits are not necessary to be written into the tag array 104 because they are already in the tag array 104. The first embodiment of the present invention holds, in the tag latch circuits 6, tag data read out of the tag array 104 when a cache miss occurs and keeps the data therein until a refill operation for the cache miss is made, as shown in FIG. 6B. The first embodiment also holds a comparison result for each tag-bit-line pair. More precisely, each of the tag write control circuits 7 provides an OR of an inversion of a comparison result provided by the tag comparator 8 and a write enable signal in a refill operation. The output of the tag write control circuit 7 is used as "a bit write enable signal" for the tag write circuit 4. As a result, no write operation is carried out on any hit bit. Namely, a write operation is carried out only on a missed bit.

Figure 7:
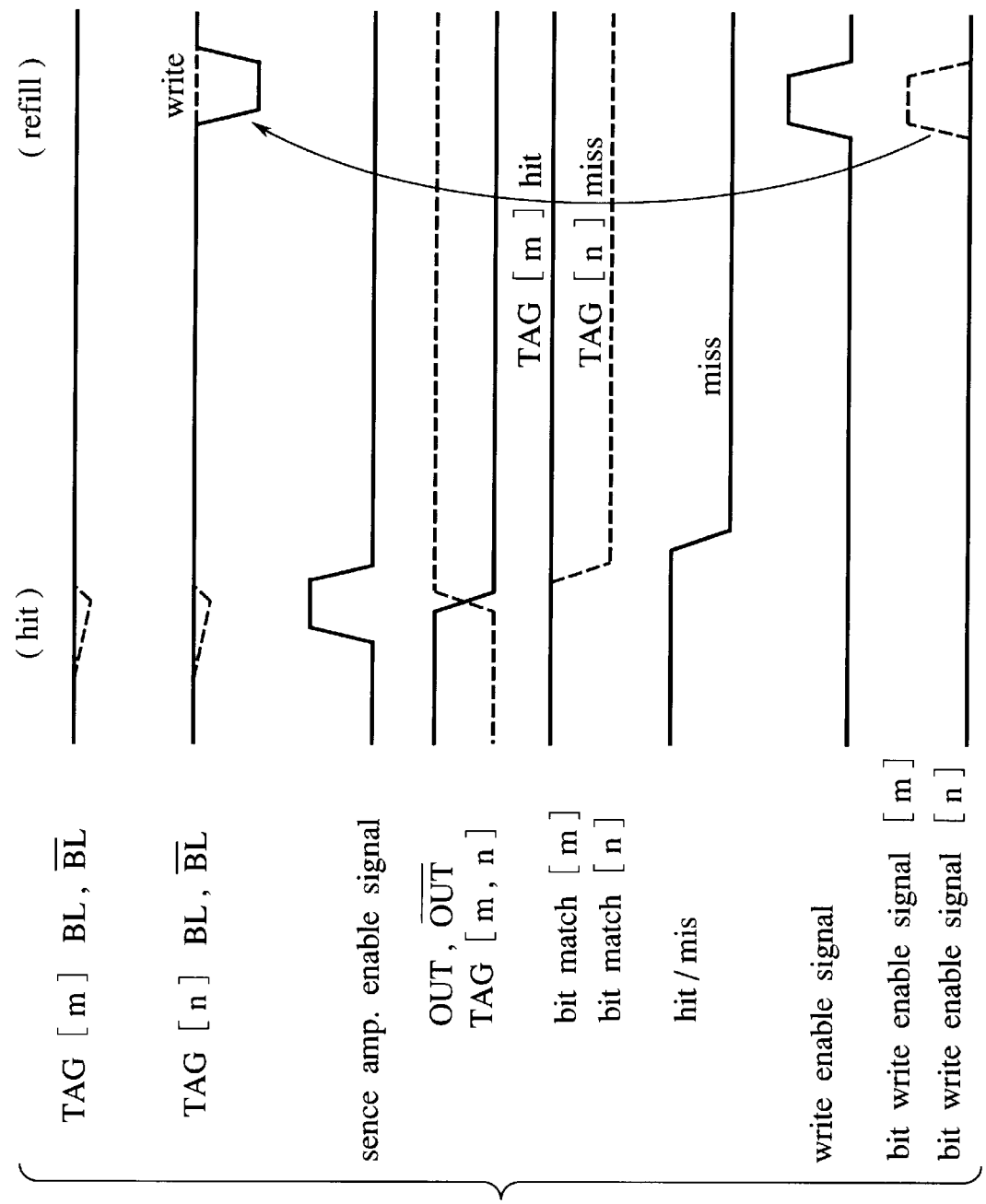
FIG. 7 is a waveform diagram showing the operation of the cache memory of FIG. 5.

FIG. 7 is a waveform diagram showing the operation of the circuits mentioned above. In FIG. 7, a tag-bit-line pair TAG[n] causes a miss to cause a cache miss to access the external memory 200. In a refill operation to be carried out thereafter, a write operation is carried out for the TAG[n] that has caused the miss, and no write operation is carried out for TAG[m] that has caused a hit. Comparison resultant data bit-match [m] and bit-match [n] of the respective bit-line pairs are kept until the refill operation, to activate only the tag write circuit 4 of the TAG[n] whose comparison resultant data indicates a miss. Consequently, a write operation is carried out only for the TAG[n].

In this way, the first embodiment carries out no write operation on a bit that shows no change between data stored in the tag array 104 and data to be written into there, thereby reducing currents consumed by the useless charging and discharging of bit lines.

Second Embodiment

Figure 8:
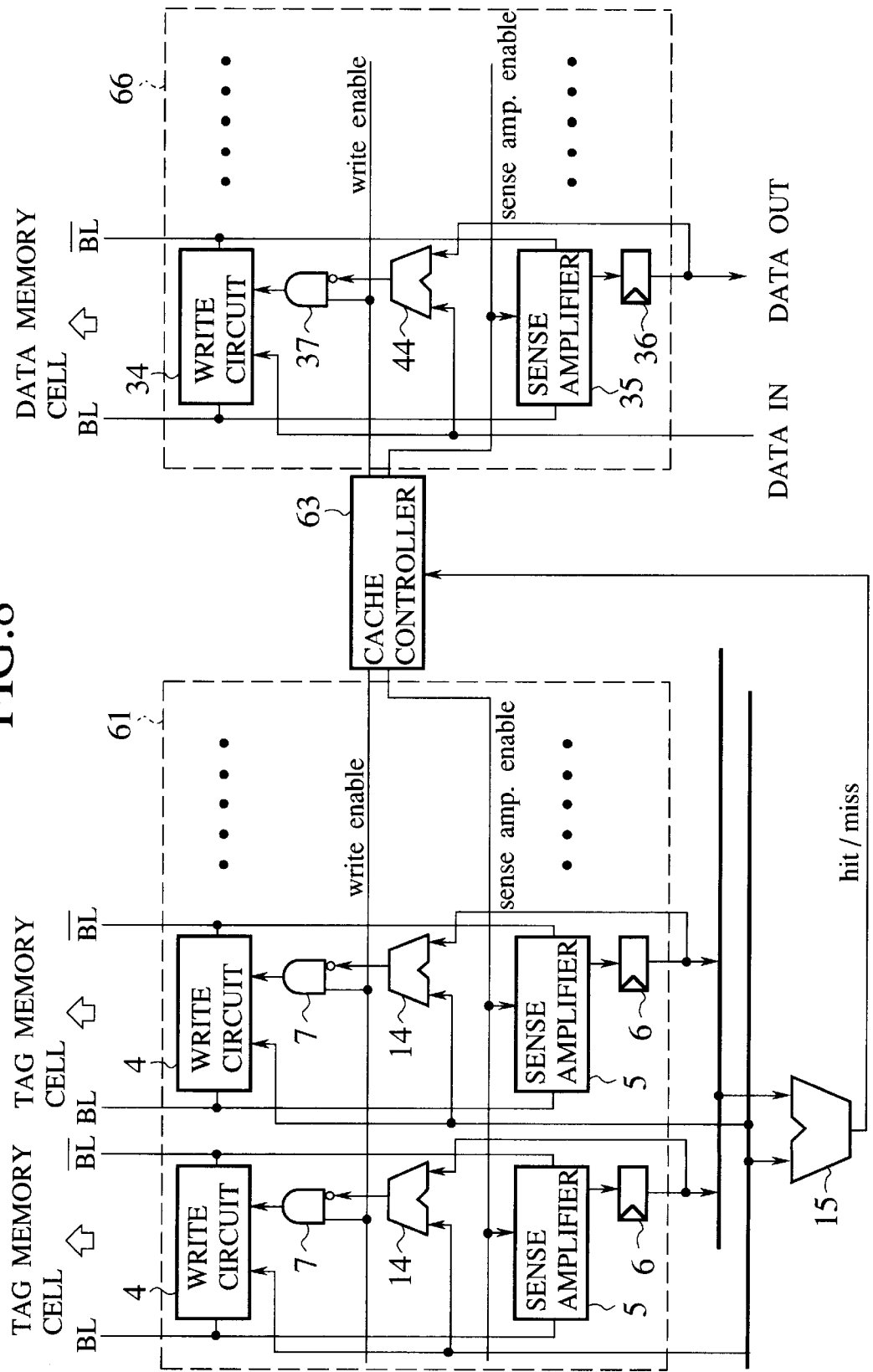
FIG. 8 shows a part of a cache memory according to a second embodiment of the present invention.

FIG. 8 shows a part of a cache memory incorporated in a microprocessor according to the second embodiment of the present invention. The second embodiment employs a tag comparator 14 instead of the tag comparator 8 of the first embodiment of FIG. 5. The tag comparator 14 compares tag data held in a tag latch circuit 6 with data to be written and determines whether or not they agree with each other. The tag comparator 14 is separate from a hit/miss detector 15 for detecting a cache hit or a cache miss and is incorporated in a read/write circuit 61 for a tag memory cell array. The tag comparator 14, the tag latch circuit 6, and a tag write control circuit 7 are arranged for each tag-bit-line pair that consists of a pair of tag bit lines BL and $\overline{BL}$. Tag data held in the tag latch circuits 6 is supplied to the hit/miss detector 15, which compares the tag data with higher bits (a tag address) of a given address. Another characteristic of the second embodiment is that a read/write circuit 66 for a data memory cell array is provided with, for each data-bit-line pair that consists of a pair of data bit lines BL and $\overline{BL}$, a data latch circuit 36, a data write control circuit 37, and a data comparator 44, similar to the read/write circuit 61 for the tag memory cell array. The other arrangements including a cache controller 63 of the second embodiment are the same as those of the first embodiment of FIGS. 4 and 5.

In a cache access operation, the tag array side reads tag data and compares it with a tag address, and at the same time, the data array side reads data corresponding to the tag data. The data read out of the tag and data arrays are held in the latch circuits 6 and 36, respectively, until the next cache access occurs. If the hit/miss detector 15 detects a cache miss, a CPU accesses an external memory, and the cache controller 63 starts a refill operation to write data sent from the external memory into the cache memory.

During the refill operation, the tag comparators 14 compare the read tag data with a tag address, and only the tag write circuit 4 of any tag bit that shows disagreement is activated to carry out a write operation. At this time, the data comparators 44 compare the read data with data from the external memory, and only the data write circuit 34 of any data bit that shows disagreement is activated to carry out a write operation. In a store operation (a data write operation from the CPU to the cache memory) too, the data array side reads data corresponding to tag data out of the data array, if a cache hit is detected. Then, the data from the CPU is written into the cache memory in the next cycle. At this time, the data read out of the data array is compared with the data from the CPU in the data comparators 44, and the data is written only for a bit that shows disagreement, similar to the refill operation.

In this way, the cache memory of the second embodiment separately arranges the tag hit/miss detector 15, which is a comparator, and the tag comparators 14 for controlling a write action in a refill operation. The second embodiment is advantageous when the layout of a microprocessor hardly allows the tag hit/miss detector 15 to be arranged in the vicinity of the tag read/write circuit 61. The second embodiment employs the same circuit arrangement on the tag array side and the data array side, to reduce the power consumption of the tag and data arrays in a refill operation, as well as reducing the power consumption of the data array in a store operation.

Third Embodiment

Figure 9:
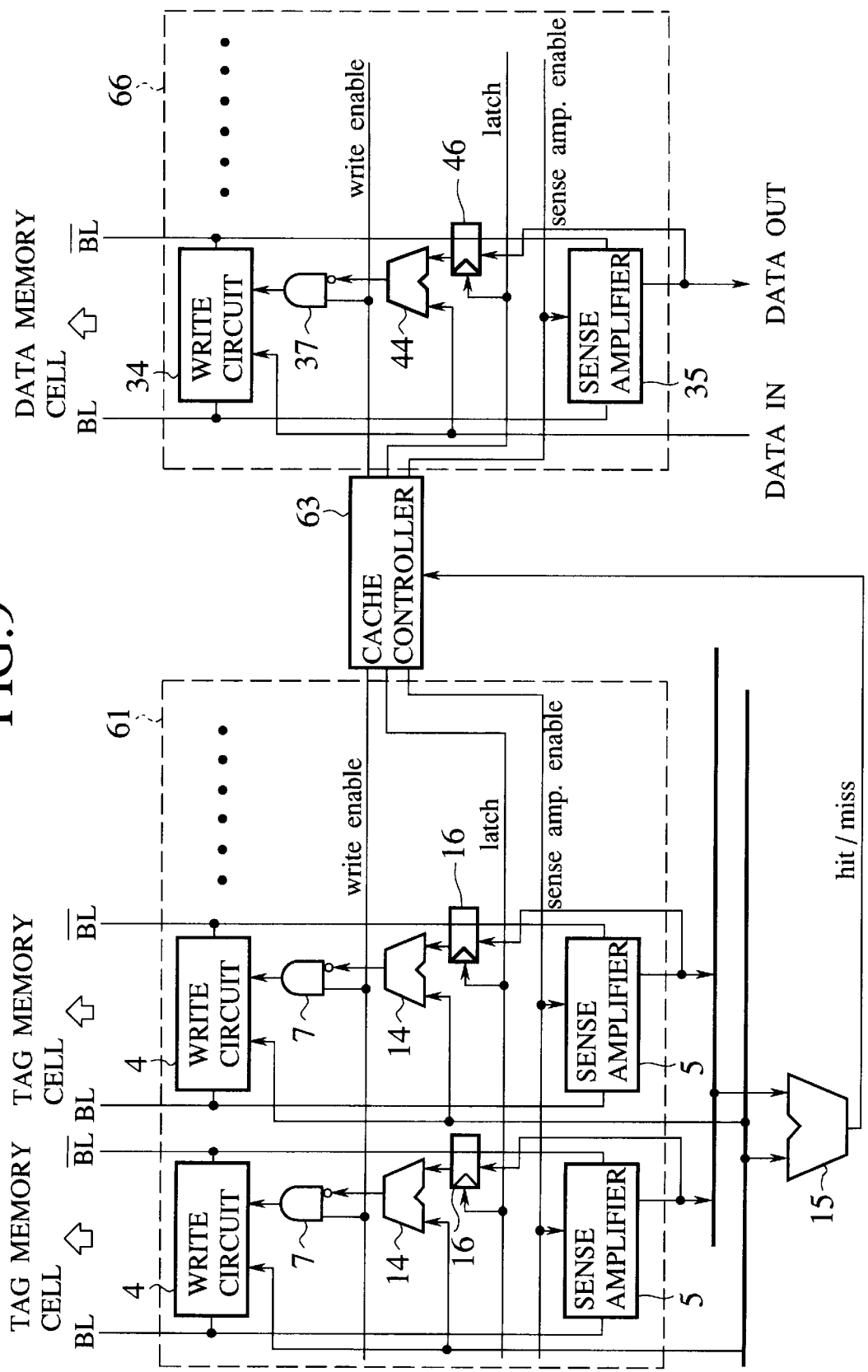
FIG. 9 shows a part of a cache memory according to a third embodiment of the present invention.

FIG. 9 shows a part of a cache memory of a microprocessor according to the third embodiment of the present invention. This cache memory employs a non-blocking cache system, which allows a cache access operation even during an access to an external memory for a refill operation due to a cache miss. Accordingly, the third embodiment employs a tag latch circuit 16 and a data latch circuit 46 instead of the latch circuits 6 and 36 of the second embodiment of FIG. 8. The tag latch circuit 16 and data latch circuit 46 respond to a latch signal provided by a cache controller 63, to latch data provided by sense amplifiers 5 and 35 only at a cache miss occasion. The latch circuits 16 and 46 hold the latched states until a refill operation for the cache miss is completed. The tag latch circuit 16 is arranged in a path that branches from a tag data read path for transferring read data from the sense amplifier 5 to a hit/miss detector 15. Namely, the tag latch circuit 16 is disposed between the sense amplifier 5 and a tag comparator 14.

The other arrangements of the third embodiment are the same as those of the second embodiment of FIG. 8.

In FIG. 9, the tag latch circuit 16 is not present in the tag data read path between the tag sense amplifier 5 and the hit/miss detector 15. Accordingly, the third embodiment is able to keep data read upon a cache miss, and at the same time, allow a cache access to another address. Similarly, the data latch circuit 46 is not present in a data read path, and therefore, the output of the data sense amplifier 35 is directly sent to a CPU. In this way, the characteristic write operation of the present invention is realized in the non-blocking cache memories.

Other Embodiments

The present invention is applicable not only to the cache memories but also to memories that carry out "a read-modify-write operation". In this case, any one of the first to third embodiments is employable with latch circuits for holding read data, comparators for comparing latched data with data to be written, and detectors for determining whether or not a write operation is carried out at the same address as the preceding read operation, to provide the effect of the present invention.

As explained above, a memory unit based on the present invention detects consecutive read and write operations carried out at the same address and disables the write operation for any bit that holds the same data as that to be written, thereby reducing the charging and discharging currents of bit lines and power consumption. In cache memories, in particular, writing data from an external memory into tag and data memory cell arrays, or writing data from a CPU into the data memory cell array always follows reading data out of the tag and data memory cell arrays. In this case, the present invention demonstrates a great advantage of reducing power consumption when writing data into the tag and/or data memory cell arrays.

In low-power-consumption cache memories, the ratio of the charging and discharging currents of bit lines to the operation currents of a refill operation reaches to about 50% when writing data from an external memory into the cache memories, or when writing data from a CPU into a data memory cell array. If there are "n/2" bits that show disagreement among n-bit data to be written, a memory unit based on the present invention is capable of reducing the current dissipation of the refill operation by about 25%.

As explained above, the present invention compares data to be written with read data bit by bit whenever read and write operations consecutively occur at the same address and disables the write operation for any bit that shows agreement, thereby reducing the current dissipation of the write operation. Consequently, the present invention provides low-power-consumption memory units such as cache memories, as well as microprocessors that employ such memory units.

Various modifications will become possible for those skilled in the art after receiving the teachings of the present disclosure without departing from the scope thereof.

What is claimed is:

1. A memory unit comprising:
   (a) a memory cell array having memory cells that are arranged in an X–Y matrix and are connected to predetermined bit lines;
   (b) latch circuits arranged for the bit lines, respectively, for holding data read out of the memory cells through the bit lines;
   (c) comparators arranged for the bit lines, respectively, for comparing data to be written into the memory cells with data held in the latch circuits and determining whether or not they agree with each other bit by bit; and
   (d) write control circuits arranged for the bit lines, respectively, for controlling a write operation of the memory cells according to comparison results provided by the comparators bit by bit,
   wherein, if read and write operations consecutively occur on the same bits and if the comparators determine that some bits of data to be written by the write operation agree with data held in the latch circuits, the write control circuits corresponding to the agreed bits disable the write operation for the bits.

2. A cache memory comprising:
   (a) a tag memory cell array having tag memory cells that are arranged in an X–Y matrix and are connected to predetermined tag bit lines;
   (b) a data memory cell array having data memory cells that are arranged in an X–Y matrix and are connected to predetermined data bit lines;
   (c) tag latch circuits arranged for the tag bit lines, respectively, for holding tag data read through the tag bit lines;
   (d) tag comparators arranged for the tag bit lines, respectively, for comparing data to be written with tag data held in the tag latch circuits; and
   (e) tag write control circuits arranged for the tag bit lines, respectively,
   wherein, in a read operation, the tag latch circuits hold tag data read out of the tag memory cell array, and in a refill operation that follows the read operation, the tag comparators compare data to be written with the tag data held in the tag latch circuits bit by bit, and if any of the tag comparators shows agreement as a comparison result, the tag write control circuit corresponding to the tag comparator in question disables a write operation for the corresponding tag bit line.

3. The cache memory of claim 2, wherein the tag comparators also serve to compare a tag address that is externally provided to access the cache memory, with tag data read out of the tag memory cell array and determine whether they hit or miss with each other.

4. The cache memory of claim 2, further comprising:
a hit/miss detector for comparing a tag address that is externally provided to access the cache memory, with tag data read out of the tag memory cell array and determining whether they hit or miss with each other,
wherein the tag comparators are arranged in the vicinity of the tag write control circuits.

5. The cache memory of claim 2, further comprising:
data latch circuits arranged for the data bit lines, respectively, for holding data read out of the data memory cells through the data bit lines;
data comparators arranged for the data bit lines, respectively, for comparing data to be written with the data held in the data latch circuits; and
data write control circuits arranged for the data bit lines, respectively,
wherein, in a read operation, the data latch circuits hold data read out of the data memory cell array, and in a refill operation that follows the read operation, the data comparators compare data to be written with the data held in the data latch circuits bit by bit, and if any of the data comparators shows agreement as a comparison result, the data write control circuit corresponding to the data comparator in question disables a write operation for the corresponding data bit line.

6. The cache memory of claim 2, wherein the tag latch circuits hold tag data read out of the tag memory cell array when a cache miss occurs and keep the tag data until a refill operation for the cache miss is completed.

7. The cache memory of claim 5, wherein the data latch circuits hold data read out of the data memory cell array when a cache miss occurs and keep the data until a refill operation for the cache miss is completed.

8. The cache memory of claim 2, further comprising:
a tag sense amplifier arranged between each of the tag bit lines and a corresponding one of the tag latch circuits.

9. The cache memory of claim 5, further comprising:
a data sense amplifier arranged between each of the data bit lines and a corresponding one of the data latch circuits.

10. The cache memory of claim 8, further comprising:
a tag write circuit arranged between each of the tag write control circuits and a corresponding one of the tag bit lines.

11. The cache memory of claim 9, further comprising:
a data write circuit arranged between each of the data write control circuits and a corresponding one of the data bit lines.

12. The cache memory of claim 8, wherein each of the tag sense amplifiers comprises a latch and a transfer gate.

13. The cache memory of claim 12, wherein:
the latch comprises a first inverter made of a p-channel MOSFET and an n-channel MOSFET that are connected in series and a second inverter made of a p-channel MOSFET and an n-channel MOSFET that are connected in series; and
the transfer gate comprises a first transfer MOSFET connected to the output side of the first inverter and the input side of the second inverter, and a second transfer MOSFET connected to the input side of the first inverter and the output side of the second inverter.

14. The cache memory of claim 13, wherein the tag latch circuit consists of a first NAND circuit to receive a first signal provided by a first node between the first transfer MOS transistor and the output side of the first inverter, and a second NAND circuit to receive a second signal provided by a second node between the second transfer MOS transistor and the output side of the second inverter.

15. The cache memory of claim 14, wherein the latch is activated in response to a sense amplifier enable signal applied to the gates of the first and second transfer MOSFETs, and the tag latch circuit changes its state in response to the first and second signals.

16. The cache memory of claim 13, wherein each of the tag bit lines consists of a first tag bit line connected to the first transfer MOSFET and a second tag bit line connected to the second transfer MOSFET.

17. The cache memory of claim 16, wherein the first and second tag bit lines are connected to main electrodes of first and second equalizing MOSFETs, respectively, the other main electrodes of the first and second equalizing MOSFETs are connected to a high level power supply, so that the first and second tag bit lines are pre-charged to a high level supply voltage in response to a bit line equalizing signal applied to the gate electrodes of the first and second equalizing MOSFETs.

18. The cache memory of claim 11, wherein the data comparators compare data provided by a CPU with the output of the data latch circuits and provide output signals to the data write control circuits.

19. The cache memory of claim 10, further comprising:
a cache controller for controlling the tag sense amplifiers and tag write control circuits.

20. The cache memory of claim 11, further comprising:
a cache controller for controlling the data sense amplifiers and data write control circuits.

21. The cache memory of claim 19, wherein:
the tag latch circuits latch data provided by the tag sense amplifiers in response to a latch signal provided by the cache controller only when a cache miss occurs; and
the outputs of the tag sense amplifiers are directly connected to the input of a hit/miss detector.

22. The cache memory of claim 20, wherein:
the data latch circuits latch data provided by the data sense amplifiers in response to a latch signal provided by the cache controller only when a cache miss occurs; and
the outputs of the data sense amplifiers are directly provided to a CPU.

23. A microprocessor comprising:
(a) a CPU;
(b) a cache controller;
(c) a bus interface unit connected to an external memory; and
(d) a cache memory having:
a tag memory cell array having tag memory cells that are arranged in an X–Y matrix and are connected to predetermined tag bit lines;
a data memory cell array having data memory cells that are arranged in an X–Y matrix and are connected to predetermined data bit lines;
tag latch circuits arranged for the tag bit lines, respectively, for holding tag data read through the tag bit lines;
tag comparators arranged for the tag bit lines, respectively, for comparing data to be written with tag data held in the tag latch circuits; and tag write control circuits arranged for the tag bit lines, respectively, wherein, in a read operation, the tag latch circuits hold tag data read out of the tag memory cell array, and in a refill operation that follows the read operation, the tag comparators compare data to be written with the tag data held in the tag latch circuits bit by bit, and if any of the tag comparators shows agreement as a comparison result, the tag write control circuit corresponding to the tag comparator in question disables a write operation for the corresponding tag bit line.

24. The microprocessor of claim 23, wherein the cache memory further has:

data latch circuits arranged for the data bit lines, respectively, for holding data read out of the data memory cells through the data bit lines;

data comparators arranged for the data bit lines, respectively, for comparing data to be written with the data held in the data latch circuits; and data write control circuits arranged for the data bit lines, respectively, wherein, in a read operation, the data latch circuits hold data read out of the data memory cell array, and in a refill operation that follows the read operation, the data comparators compare data to be written with the data held in the data latch circuits bit by bit, and if any of the data comparators shows agreement as a comparison result, the data write control circuit corresponding to the data comparator in question disables a write operation for the corresponding data bit line.

\* \* \* \* \*